(12) United States Patent
Nichols, Sr. et al.

(10) Patent No.: US 10,755,554 B2
(45) Date of Patent: Aug. 25, 2020

(54) VECTOR MAGNETIC TAMPER DETECTION FOR SENSORS

(71) Applicant: Nortek Security & Control LLC, Carlsbad, CA (US)

(72) Inventors: Frank Raymond Nichols, Sr., Oceanside, CA (US); Sivakumar Kathan, Ocenaside, CA (US)

(73) Assignee: Nortek Security & Control LLC, Carlsbad, CA (US)

( * ) Notice: Subject to any disclaimer, the term of this patent is extended or adjusted under 35 U.S.C. 154(b) by 141 days.

(21) Appl. No.: 16/146,724

(22) Filed: Sep. 28, 2018

(65) Prior Publication Data

US 2020/0105124 A1    Apr. 2, 2020

(51) Int. Cl.
| | |
|---|---|
| *G08B 29/04* | (2006.01) |
| *G08B 13/08* | (2006.01) |
| *G08B 13/24* | (2006.01) |
| *G01R 33/10* | (2006.01) |
| *G01R 33/00* | (2006.01) |

(52) U.S. Cl.
CPC ....... *G08B 29/046* (2013.01); *G01R 33/0035* (2013.01); *G01R 33/10* (2013.01); *G08B 13/08* (2013.01); *G08B 13/2491* (2013.01)

(58) Field of Classification Search
CPC .. G01R 15/202; G01R 33/07; G01R 19/0092; G01R 19/10
USPC ................... 324/117 H, 76.52, 76.39, 76.11
See application file for complete search history.

(56) References Cited

U.S. PATENT DOCUMENTS

| | | |
|---|---|---|
| 5,673,021 A | 9/1997 | Woods |
| 5,880,659 A | 3/1999 | Woods |
| 6,609,738 B1 | 8/2003 | Roth et al. |
| 6,784,796 B2 | 8/2004 | Johnston et al. |
| 7,602,286 B2 | 10/2009 | Dipoala |
| 8,847,580 B1 | 9/2014 | Osterweil |
| 8,970,373 B2 | 3/2015 | Buckley et al. |
| 9,558,639 B2 | 1/2017 | Modi et al. |
| 9,702,165 B2 | 7/2017 | Feirer et al. |
| 9,953,515 B2 | 4/2018 | Hanrahan |

(Continued)

FOREIGN PATENT DOCUMENTS

| | | |
|---|---|---|
| CN | 202017406 | 10/2011 |
| CN | 107462148 | 12/2017 |

(Continued)

OTHER PUBLICATIONS

"1032 Series Surface Mount Contacts", GE Security Datasheet, Steven Engineering, (2009), 50 pgs.

(Continued)

*Primary Examiner* — Giovanni Astacio-Oquendo

(74) *Attorney, Agent, or Firm* — Schwegman Lundberg & Woessner, P.A.

(57) ABSTRACT

A magnetometer sensor that detects tampering is described. The sensor samples magnetometer data and computes a set of vectors based on the magnetometer data. The sensor detects a tampering of the magnetic sensor based on determining that the set of vectors is outside the reference plane for the magnetometer sensor. The sensor generates a notification to a security system coupled to the magnetometer sensor. The notification indicating the tampering of the magnetometer sensor.

20 Claims, 10 Drawing Sheets

(56) References Cited

U.S. PATENT DOCUMENTS

| | | | |
|---|---|---|---|
| 2007/0212036 A1* | 9/2007 | Halsall | F24H 1/202 |
| | | | 392/451 |
| 2009/0243597 A1 | 10/2009 | Spenik et al. | |
| 2013/0265163 A1 | 10/2013 | Joyce | |
| 2014/0263280 A1* | 9/2014 | Ramacciotti | H05B 3/06 |
| | | | 219/528 |
| 2015/0059780 A1* | 3/2015 | Davis | A24F 47/008 |
| | | | 131/328 |
| 2017/0098356 A1 | 4/2017 | Dai et al. | |
| 2017/0193724 A1 | 7/2017 | Johnson et al. | |

FOREIGN PATENT DOCUMENTS

| | | |
|---|---|---|
| EP | 3107077 | 12/2016 |
| JP | 2018025001 | 2/2018 |
| WO | 2017117397 | 7/2017 |
| WO | 2018055398 | 3/2018 |

OTHER PUBLICATIONS

"ADT-Monitored Door Sensors and Window Sensors", ADT Monitored Home Security, [Online] Retrieved from the Internet: <URL: https://www.protectyourhome.com/home-security-equipment/window-sensor-door-sensor>, (Retrieved on Sep. 18, 2019), 6 pgs.

Voigt, Josefin, "Angular positioning of a door or window—using MEMS accelerometer and a magnetometer", Master's Thesis in Electrical Measurements at Lund University, SE, (2015), 119 pgs.

* cited by examiner

VECTOR MAGNETIC TAMPER DETECTION FOR SENSORS

BACKGROUND

Door and window sensors that operates using a magnetic switch (e.g., Reed switch) are subject to tampering. For example, a rogue magnet can be used to bypass the sensor and trick the magnetic switch that the door or window is still closed.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Glossary

Figure 1:
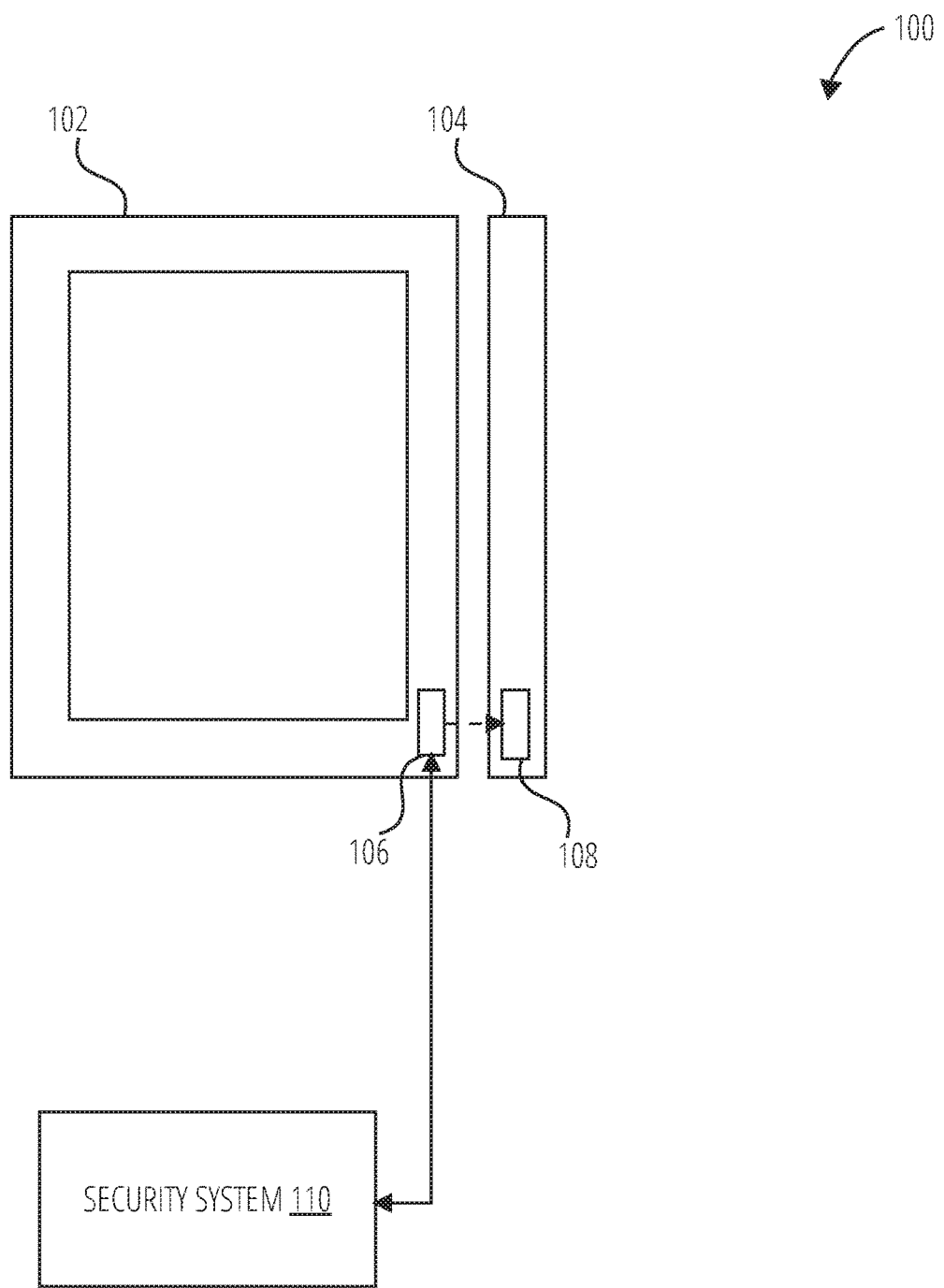
FIG. 1 illustrates a security environment in accordance with one example embodiment.

"Component" in this context refers to a device, physical entity, or logic having boundaries defined by function or subroutine calls, branch points, APIs, or other technologies that provide for the partitioning or modularization of particular processing or control functions. Components may be combined via their interfaces with other components to carry out a machine process. A component may be a packaged functional hardware unit designed for use with other components and a part of a program that usually performs a particular function of related functions. Components may constitute either software components (e.g., code embodied on a machine-readable medium) or hardware components. A "hardware component" is a tangible unit capable of performing certain operations and may be configured or arranged in a certain physical manner. In various example embodiments, one or more computer systems (e.g., a standalone computer system, a client computer system, or a server computer system) or one or more hardware components of a computer system (e.g., a processor or a group of processors) may be configured by software (e.g., an application or application portion) as a hardware component that operates to perform certain operations as described herein. A hardware component may also be implemented mechanically, electronically, or any suitable combination thereof. For example, a hardware component may include dedicated circuitry or logic that is permanently configured to perform certain operations. A hardware component may be a special-purpose processor, such as a field-programmable gate array (FPGA) or an application specific integrated circuit (ASIC). A hardware component may also include programmable logic or circuitry that is temporarily configured by software to perform certain operations. For example, a hardware component may include software executed by a general-purpose processor or other programmable processor. Once configured by such software, hardware components become specific machines (or specific components of a machine) uniquely tailored to perform the configured functions and are no longer general-purpose processors. It will be appreciated that the decision to implement a hardware component mechanically, in dedicated and permanently configured circuitry, or in temporarily configured circuitry (e.g., configured by software), may be driven by cost and time considerations. Accordingly, the phrase "hardware component"(or "hardware-implemented component") should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware components are temporarily configured (e.g., programmed), each of the hardware components need not be configured or instantiated at any one instance in time. For example, where a hardware component comprises a general-purpose processor configured by software to become a special-purpose processor, the general-purpose processor may be configured as respectively different special-purpose processors (e.g., comprising different hardware components) at different times. Software accordingly configures a particular processor or processors, for example, to constitute a particular hardware component at one instance of time and to constitute a different hardware component at a different instance of time. Hardware components can provide information to, and receive information from, other hardware components. Accordingly, the described hardware components may be regarded as being communicatively coupled. Where multiple hardware components exist contemporaneously, communications may be achieved through signal transmission (e.g., over appropriate circuits and buses) between or among two or more of the hardware components. In embodiments in which multiple hardware components are configured or instantiated at different times, communications between such hardware components may be achieved, for example, through the storage and retrieval of information in memory structures to which the multiple hardware components have access. For example, one hardware component may perform an operation and store the output of that operation in a memory device to which it is communicatively coupled. A further hardware component may then, at a later time, access the memory device to retrieve and process the stored output. Hardware components may also initiate communications with input or output devices, and can operate on a resource (e.g., a collection of information). The various operations of example methods described herein may be performed, at least partially, by one or more processors that are temporarily configured (e.g., by software) or permanently configured to perform the relevant operations. Whether temporarily or permanently configured, such processors may constitute processor-implemented components that operate to perform one or more operations or functions described herein. As used herein, "processor-implemented component" refers to a hardware component implemented using one or more processors. Similarly, the methods described herein may be at least partially processor-implemented, with a particular processor or processors being an example of hardware. For example, at least some of the operations of a method may be performed by one or more processors or processor-implemented components. Moreover, the one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., an API). The performance of certain of the operations may be distributed among the processors, not only residing within a single machine, but deployed across a number of machines. In some example embodiments, the processors or processor-implemented components may be located in a single geographic location (e.g., within a home environment, an office environment, or a server farm). In other example embodiments, the processors or processor-implemented components may be distributed across a number of geographic locations.

"Communication Network" in this context refers to one or more portions of a network that may be an ad hoc network, an intranet, an extranet, a virtual private network (VPN), a local area network (LAN), a wireless LAN (WLAN), a wide area network (WAN), a wireless WAN (WWAN), a metropolitan area network (MAN), the Internet, a portion of the Internet, a portion of the Public Switched Telephone Network (PSTN), a plain old telephone service (POTS) network, a cellular telephone network, a wireless network, a Wi-Fi® network, another type of network, or a combination of two or more such networks. For example, a network or a portion of a network may include a wireless or cellular network and the coupling may be a Code Division Multiple Access (CDMA) connection, a Global System for Mobile communications (GSM) connection, or other types of cellular or wireless coupling. In this example, the coupling may implement any of a variety of types of data transfer technology, such as Single Carrier Radio Transmission Technology (1×RTT), Evolution-Data Optimized (EVDO) technology, General Packet Radio Service (GPRS) technology, Enhanced Data rates for GSM Evolution (EDGE) technology, third Generation Partnership Project (3GPP) including 3G, fourth generation wireless (4G) networks, Universal Mobile Telecommunications System (UMTS), High Speed Packet Access (HSPA), Worldwide Interoperability for Microwave Access (WiMAX), Long Term Evolution (LTE) standard, others defined by various standard-setting organizations, other long-range protocols, or other data transfer technology.

"Machine-Storage Medium" in this context refers to a single or multiple storage devices and/or media (e.g., a centralized or distributed database, and/or associated caches and servers) that store executable instructions, routines and/or data. The term shall accordingly be taken to include, but not be limited to, solid-state memories, and optical and magnetic media, including memory internal or external to processors. Specific examples of machine-storage media, computer-storage media and/or device-storage media include non-volatile memory, including by way of example semiconductor memory devices, e.g., erasable programmable read-only memory (EPROM), electrically erasable programmable read-only memory (EEPROM), FPGA, and flash memory devices; magnetic disks such as internal hard disks and removable disks; magneto-optical disks; and CD-ROM and DVD-ROM disks The terms "machine-storage medium," "device-storage medium," "computer-storage medium" mean the same thing and may be used interchangeably in this disclosure. The terms "machine-storage media," "computer-storage media," and "device-storage media" specifically exclude carrier waves, modulated data signals, and other such media, at least some of which are covered under the term "signal medium."

"Processor" in this context refers to any circuit or virtual circuit (a physical circuit emulated by logic executing on an actual processor) that manipulates data values according to control signals (e.g., "commands", "op codes", "machine code", etc.) and which produces corresponding output signals that are applied to operate a machine. A processor may, for example, be a Central Processing Unit (CPU), a Reduced Instruction Set Computing (RISC) processor, a Complex Instruction Set Computing (CISC) processor, a Graphics Processing Unit (GPU), a Digital Signal Processor (DSP), an Application Specific Integrated Circuit (ASIC), a Radio-Frequency Integrated Circuit (RFIC) or any combination thereof. A processor may further be a multi-core processor having two or more independent processors (sometimes referred to as "cores") that may execute instructions contemporaneously.

"Carrier Signal" in this context refers to any intangible medium that is capable of storing, encoding, or carrying instructions for execution by the machine, and includes digital or analog communications signals or other intangible media to facilitate communication of such instructions. Instructions may be transmitted or received over a network using a transmission medium via a network interface device.

"Signal Medium" in this context refers to any intangible medium that is capable of storing, encoding, or carrying the instructions for execution by a machine and includes digital or analog communications signals or other intangible media to facilitate communication of software or data. The term "signal medium" shall be taken to include any form of a modulated data signal, carrier wave, and so forth. The term "modulated data signal" means a signal that has one or more of its characteristics set or changed in such a matter as to encode information in the signal. The terms "transmission medium" and "signal medium" mean the same thing and may be used interchangeably in this disclosure.

"Computer-Readable Medium" in this context refers to both machine-storage media and transmission media. Thus, the terms include both storage devices/media and carrier waves/modulated data signals. The terms "machine-readable medium," "computer-readable medium" and "device-readable medium" mean the same thing and may be used interchangeably in this disclosure.

Description

The description that follows describes systems, methods, techniques, instruction sequences, and computing machine program products that illustrate example embodiments of the present subject matter. In the following description, for purposes of explanation, numerous specific details are set forth in order to provide an understanding of various embodiments of the present subject matter. It will be evident, however, to those skilled in the art, that embodiments of the present subject matter may be practiced without some or other of these specific details. Examples merely typify possible variations. Unless explicitly stated otherwise, structures (e.g., structural components, such as modules) are optional and may be combined or subdivided, and operations (e.g., in a procedure, algorithm, or other function) may vary in sequence or be combined or subdivided.

A rogue magnet can be used to trick a reed switch sensor that a door or window is still closed. An intruder may place the rogue magnet outside the window to be circumvent the sensor. The present application describes a sensor that prevents an external rogue magnet to bypassing sensor reading or state. In one example embodiment, the rogue magnet moves in the direction of a Z axis which typically come from the outside of the mounted door/window. The direction in −Z axis can come from inside the house. Genuine or authentic magnet moves in the direction of X and −X or along an axis in a plane. The sensor identifies the direction from which the magnetic field is coming. Using the vector reading of the magnetic field and history, the sensor identifies the normal use case from the collected data samples stored as history. In one example, machine learning can be used to distinguish and learn normal use cases from abnormal cases. This learning method can happen automatically. In one example embodiment, the sensor identifies an abnormal case when the magnetic field comes from Z axis, instead of X axis.

In one example embodiment, the sensor samples magnetometer data and computes a set of vectors based on the magnetometer data. The sensor detects a tampering of the magnetic sensor based on determining that the set of vectors is outside the reference plane for the magnetometer sensor. The sensor generates a notification to a security system coupled to the magnetometer sensor. The notification indicating the tampering of the magnetometer sensor.

FIG. 1 illustrates a security environment in accordance with one example embodiment. FIG. 1 is a diagram illustrating a sensor device 106 mounted to a window 102. The window 102 is illustrated in a closed position in FIG. 1. A magnet 108 is mounted to a frame 104 adjacent to the window 102. The magnet 108 forms a magnetic field that is picked up by the sensor device 106. The sensor device 106 is coupled (e.g., wired or wirelessly) to a security system 110. The sensor device 106 provides a status (e.g., close or open) to the security system 110.

Figure 2:
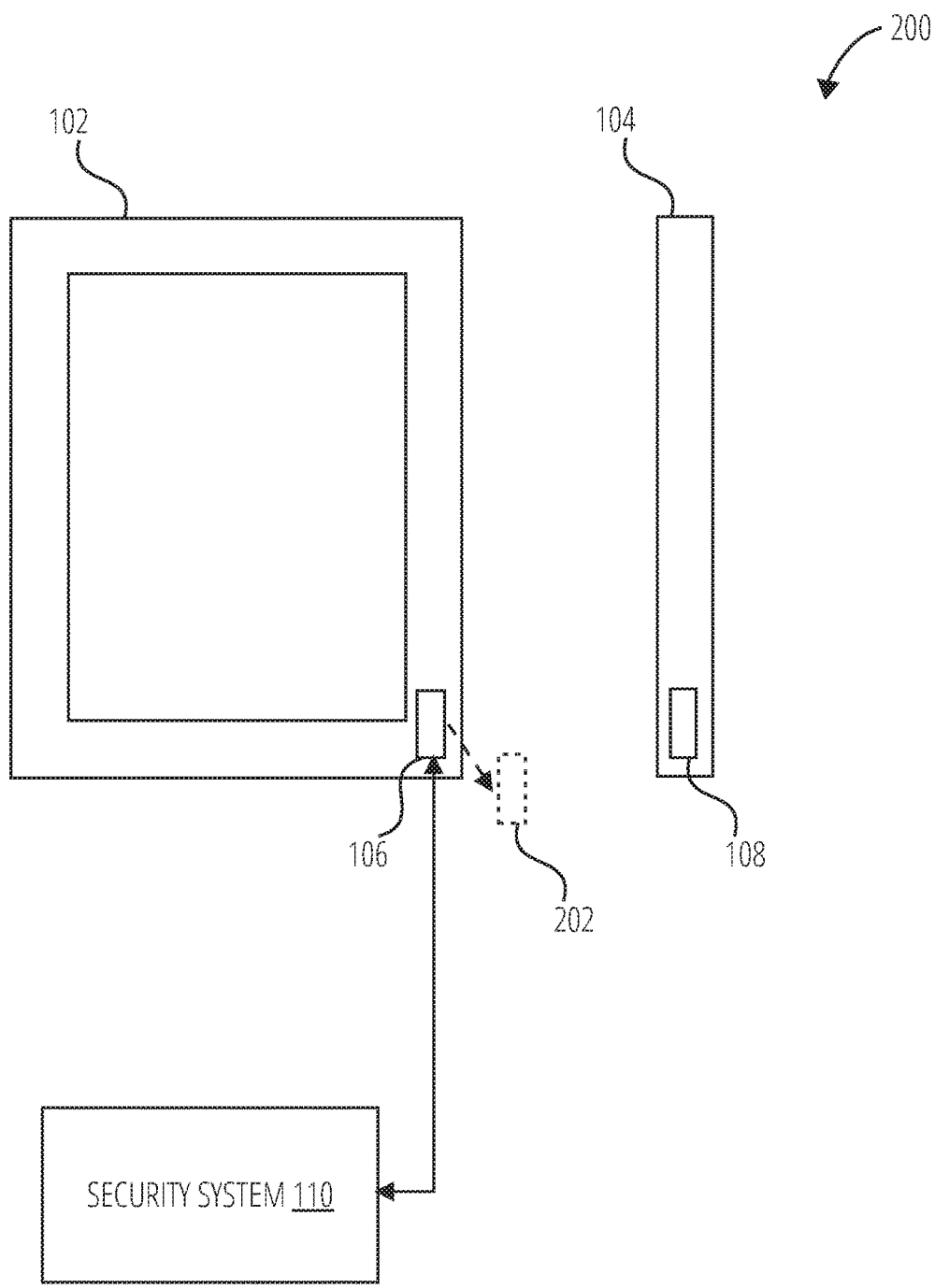
FIG. 2 illustrates a security environment in accordance with one example embodiment.

FIG. 2 illustrates a security environment in accordance with one example embodiment. The window 102 is illustrated in an open position in FIG. 2. A rogue magnet 202 is presented outside the window 102 and is placed adjacent to the sensor device 106. The rogue magnet 202 forms a magnetic field that is picked up by the sensor device 106. The sensor device 106 is coupled (e.g., wired or wirelessly) to a security system 110. The sensor device 106 provides a status (e.g., close, open, tamper detected) to the security system 110. In the present application, the sensor device 106 detects the rogue magnet 202 and notifies the security system 110.

Figure 3:
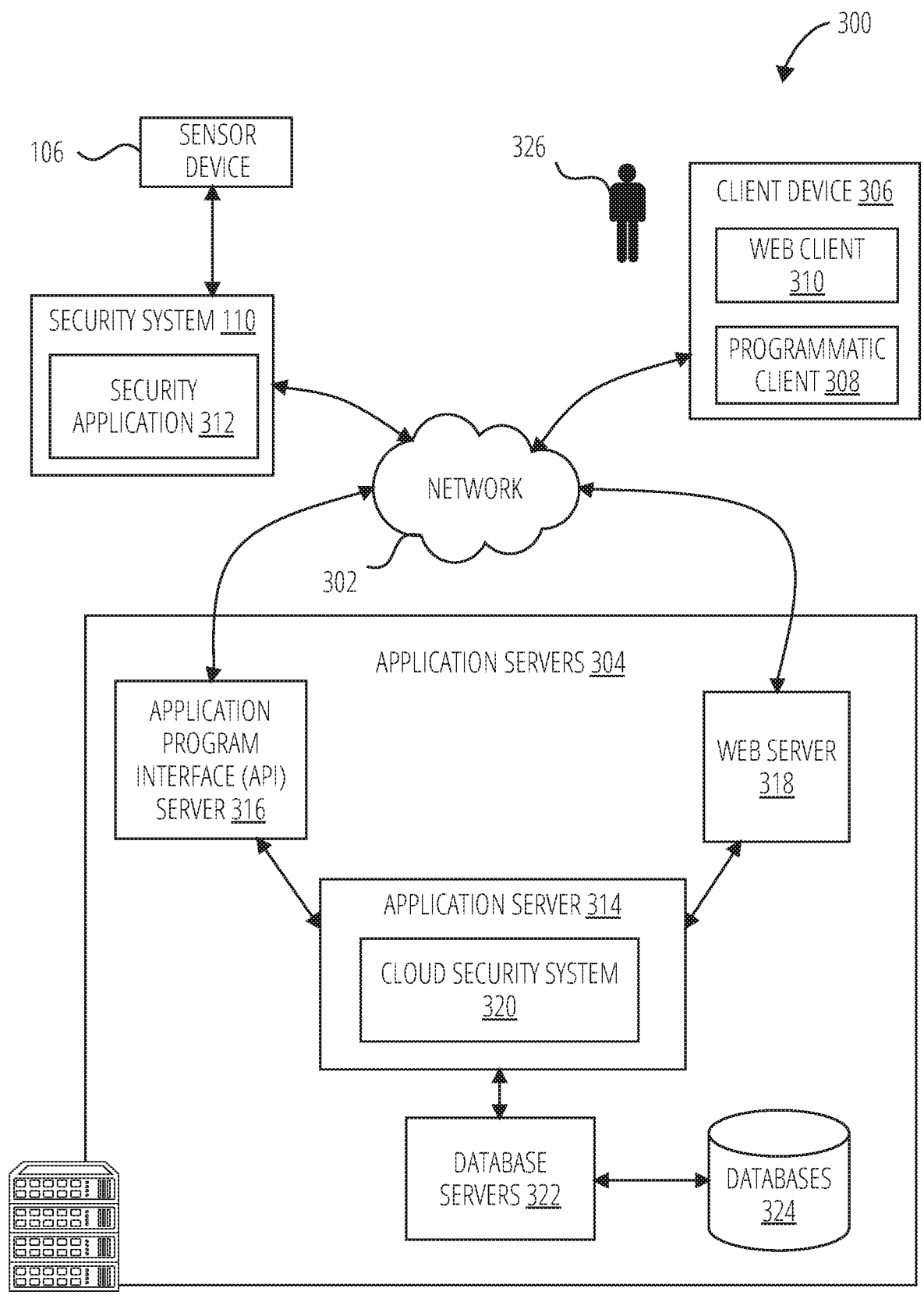
FIG. 3 is a diagrammatic representation of a networked environment in which the present disclosure may be deployed, in accordance with some example embodiments.

FIG. 3 is a diagrammatic representation of a network environment 300 in which some example embodiments of the present disclosure may be implemented or deployed.

One or more application servers 304 provide server-side functionality via a network 302 to a networked user device, in the form of a client device 110. A web client 310 (e.g., a browser) and a programmatic client 308 (e.g., an "app") are hosted and execute on the web client 310.

An Application Program Interface (API) server 316 and a web server 318 provide respective programmatic and web interfaces to application servers 304. A specific application server 314 hosts a cloud security system 320, which includes components, modules and/or applications.

The web client 310 communicates with the cloud security system 320 via the web interface supported by the web server 318. Similarly, the programmatic client 308 communicates with the cloud security system 320 via the programmatic interface provided by the Application Program Interface (API) server 316.

The cloud security system 320 may also, for example, communicate with a security application 312 at the security system 110. The security system 110 may be located at a home or business. The sensor device 106 monitors a window or door at the home or business. The sensor device 106 communicates with the security system 110.

The application server 314 is shown to be communicatively coupled to database servers 322 that facilitates access to an information storage repository or databases 324. In an example embodiment, the databases 324 includes storage devices that store information to be published and/or processed by the cloud security system 320.

Additionally, the security application 312 executing on the security system 110, is shown as having programmatic access to the application server 314 via the programmatic interface provided by the Application Program Interface (API) server 316. For example, the security application 312, using information retrieved from the application server 314, may supports one or more features or functions on a website hosted by the third party.

Any of the systems or machines (e.g., databases, devices, servers) shown in, or associated with, FIG. 3 may be, include, or otherwise be implemented in a special-purpose (e.g., specialized or otherwise non-generic) computer that has been modified (e.g., configured or programmed by software, such as one or more software modules of an application, operating system, firmware, middleware, or other program) to perform one or more of the functions described herein for that system or machine. For example, a special-purpose computer system able to implement any one or more of the methodologies described herein is discussed below with respect to FIG. 10, and such a special-purpose computer may accordingly be a means for performing any one or more of the methodologies discussed herein. Within the technical field of such special-purpose computers, a special-purpose computer that has been modified by the structures discussed herein to perform the functions discussed herein is technically improved compared to other special-purpose computers that lack the structures discussed herein or are otherwise unable to perform the functions discussed herein. Accordingly, a special-purpose machine configured according to the systems and methods discussed herein provides an improvement to the technology of similar special-purpose machines.

Moreover, any two or more of the systems or machines illustrated in FIG. 3 may be combined into a single system or machine, and the functions described herein for any single system or machine may be subdivided among multiple systems or machines. Additionally, any number and types of client device 306 may be embodied within the network environment 300. Furthermore, some components or functions of the network environment 300 may be combined or located elsewhere in the network environment 300. For example, some of the functions of the client device 306 may be embodied at the application server 314.

Figure 4:
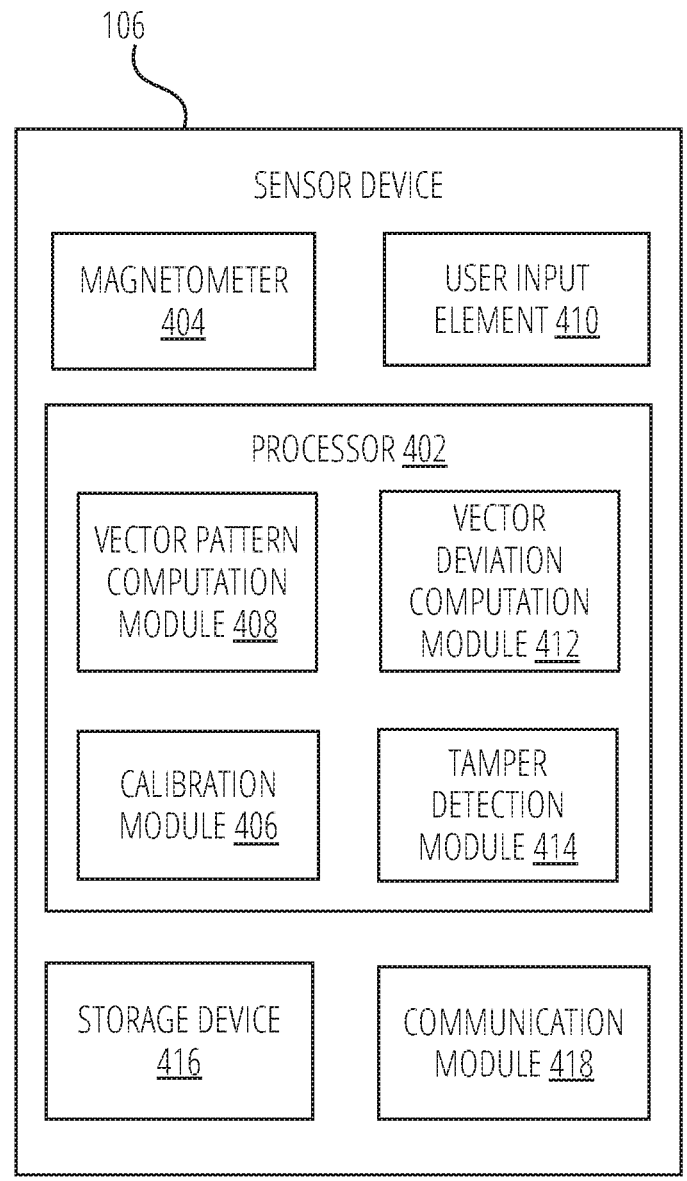
FIG. 4 illustrates a sensor device in accordance with one example embodiment.

FIG. 4 illustrates a sensor device in accordance with one example embodiment. The sensor device 106 includes a magnetometer 404, a user input element 410, a processor 402, a storage device 416, and a communication module 418. The magnetometer 404 measures the magnetic field relative to the sensor device 106. In one example embodiment, the magnetometer 404 generates magnetometer sensor data representing the detected magnetic field at the sensor device 106. The user input element 410 includes, for example, a physical button or any other user input to trigger or set the sensor device 106 into a calibration mode. The storage device 416 stores the magnetometer sensor data from the magnetometer 404. The communication module 418 is configured to communicate with the security system 110.

In one example embodiment, the processor 402 includes a vector pattern computation module 408, a vector deviation computation module 412, a calibration module 406, and a tamper detection module 414. The calibration module 406 directs the vector pattern computation module 408 to compute a vector pattern based on sample magnetometer sensor data collected from the magnetometer 404 during a calibration mode (e.g., normal usage pattern). For example, each vector may be identified using a three-axis coordinate system.

The vector deviation computation module 412 computes a deviation of the vectors from the vector pattern. The tamper detection module 414 directs the vector pattern computation module 408 to compute a vector pattern based on sample magnetometer sensor data collected from the magnetometer 404 outside the calibration mode. The vector deviation computation module 412 computes a deviation of these vectors collected outside the calibration mode. The tamper detection module 414 compares the vector patterns from the calibration mode with the vector patterns from the non-calibration mode to detect a tamper. In one example embodiment, the tamper detection module 414 determines that the direction of the vectors indicate a direction that is substantially different that the typical direction of vectors during normal usage. For example, the tamper detection module 414 determines that a direction of a vector is outside a direction range based on the historical samples and the vector deviation.

Figure 5:
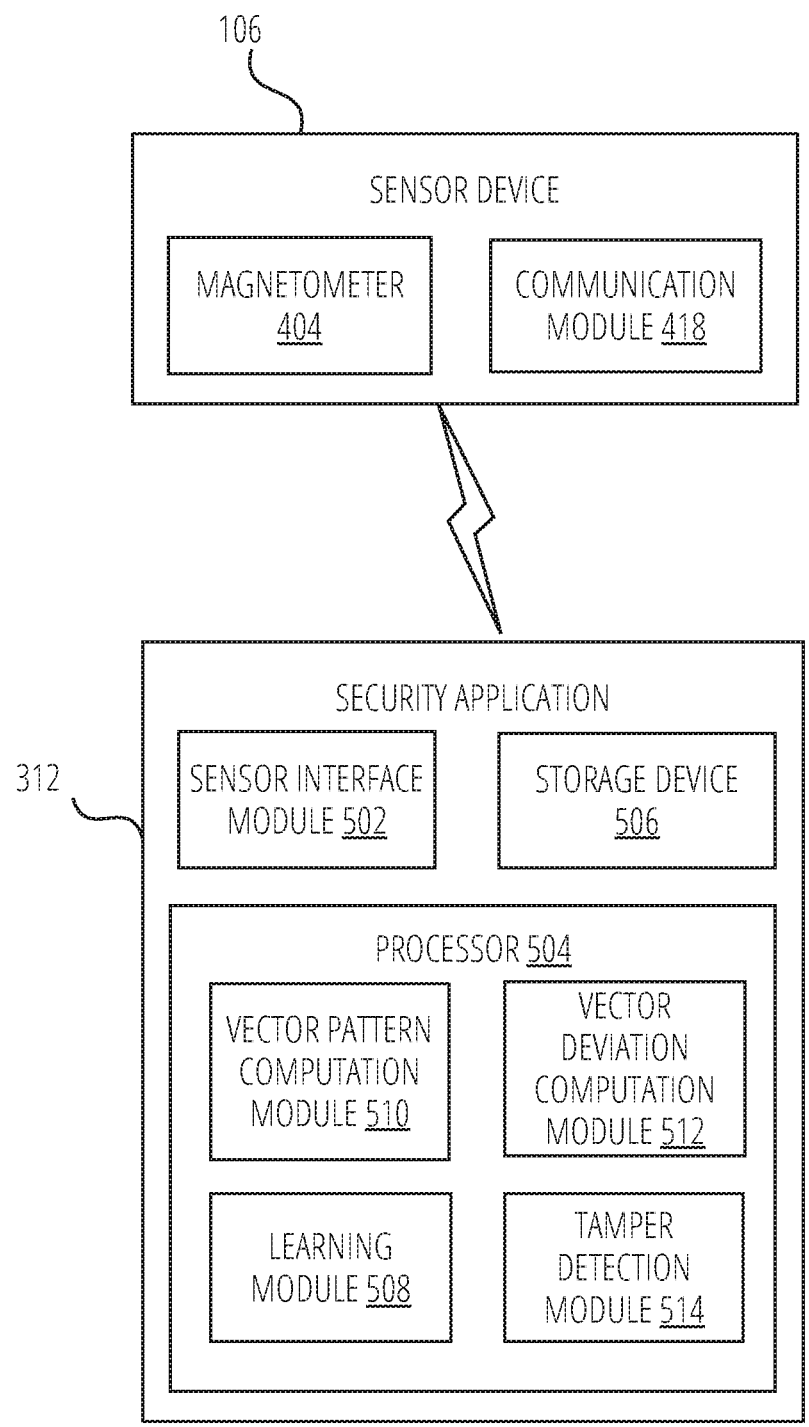
FIG. 5 illustrates a sensor device in communication with a security application in accordance with another example embodiment.

FIG. 5 illustrates another example embodiment of the sensor device 106 in communication with the security application 312 in accordance with one example embodiment. The sensor device 106 includes the magnetometer 404 and the communication module 418. The communication module 418 communicates with the security application 312.

In one example embodiment, the security application 312 includes a sensor interface module 502, a storage device 506, and a processor 504. The sensor interface module 502 communicates with the communication module 418 and accesses sensor data (e.g., magnetometer sensor data) from the magnetometer 404. The storage device 506 stores historical sensor data from the magnetometer 404.

The processor 504 includes a vector deviation computation module 512, a vector deviation computation module 512, a learning module 508, and a tamper detection module 514. The learning module 508 directs the vector pattern computation module 510 to compute a vector pattern based on sample magnetometer sensor data collected from the magnetometer 404 during a learning mode (e.g., normal usage pattern). For example, each vector may be identified using a three-axis coordinate system.

The vector deviation computation module 512 computes a deviation of the vectors from the vector pattern. The tamper detection module 514 directs the vector pattern computation module 510 to compute a vector pattern based on new sample magnetometer sensor data collected from the magnetometer 404. The vector deviation computation module 512 computes a deviation of these vectors collected outside the learning mode. The tamper detection module 514 compares the vector patterns determined under normal operating mode of the window/door with new vector patterns to detect a tamper.

Figure 6:
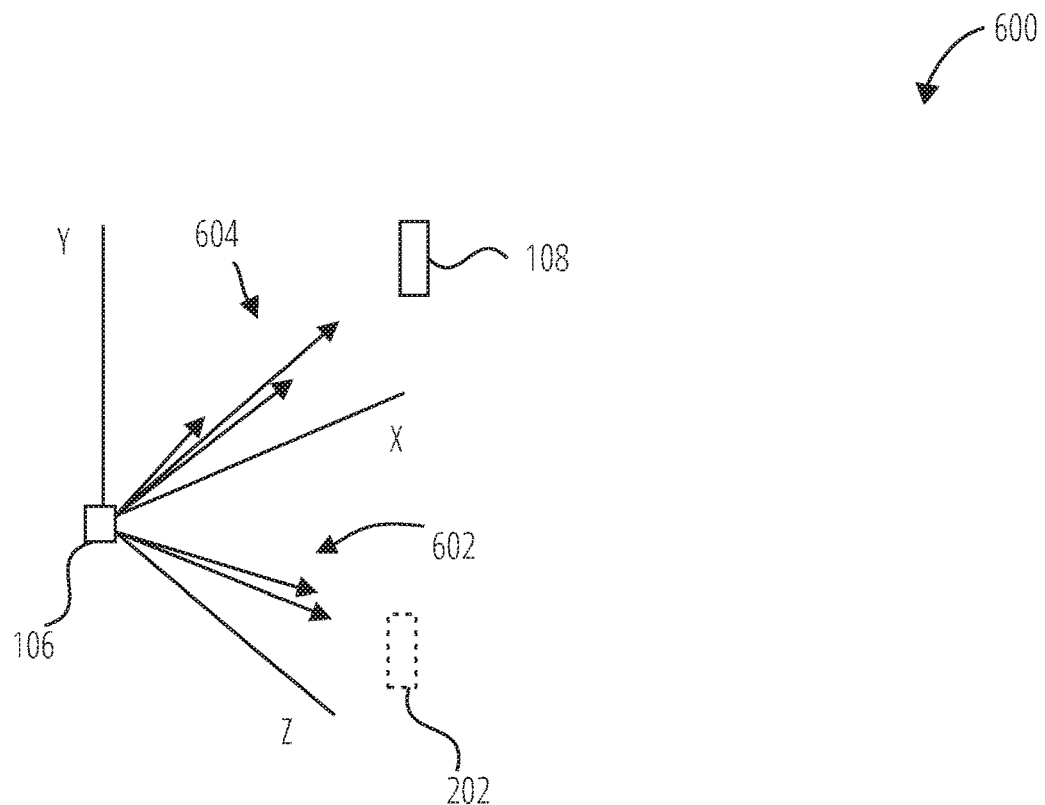
FIG. 6 illustrates a graph in accordance with one example embodiment.

FIG. 6 illustrates a graph 600 of vectors in accordance with one example embodiment. The sensor device 106 detects magnetic fields from the magnet 108 and the rogue magnet 202. The sensor device 106 generates a vector to represent a direction of the magnet 108 and rogue magnet 202 relative to the sensor device 106. For example, the sensor device 106 samples magnetic sensor data from the magnet 108 (during normal usage or a calibration mode) and forms a set of vectors 604 based on the magnetic sensor data from the magnet 108. For example, the set of vectors 604 may be represented as:

$$\vec{p}_0 = \vec{i}_0 x + \vec{j}_0 y + \vec{k}_0 z$$

$$\vec{p}_1 = \vec{i}_1 x + \vec{j}_1 y + \vec{k}_1 z$$

$$\vec{p}_n = \vec{i}_n x + \vec{j}_n y + \vec{k}_n z$$

where $p_n$ represent each vector, x, y, and z represent the three-dimensional axis, i, j, and k represents the magnitude/intensity for each corresponding axis. In one example embodiment, the vector pattern computation module 408 computes the set of vectors 602. The vector deviation computation module 412 computes an acceptable deviation for the set of vectors 602.

The sensor device 106 samples magnetic sensor data from the rogue magnet 202 and forms a set of vectors 602 based on the magnetic sensor data from the rogue magnet 202. For example, the set of vectors 604 may be represented as:

$$\vec{q}_0 = \vec{i}_0 x + \vec{j}_0 y + \vec{k}_0 z$$

$$\vec{q}_1 = \vec{i}_1 x + \vec{j}_1 y + \vec{k}_1 z$$

$$\vec{q}_n = \vec{i}_n x + \vec{j}_n y + \vec{k}_n z$$

where $p_n$ represent each vector, x, y, and z represent the three-dimensional axis, i, j, and k represents the magnitude/intensity for each corresponding axis. In one example embodiment, the vector pattern computation module 408 computes the set of vectors 604. The vector deviation computation module 412 computes an acceptable deviation for the set of vectors 604.

The tamper detection module 414 compares the set of vectors 602 (normal usage vector pattern) with the set of vectors 604 (new vector pattern) to determine whether the set of vectors 604 indicates a direction substantially different from the direction from the set of vectors 602. In one example embodiment, vector pattern computation module 408 computes a first vector based on an average of the set of vectors 602 and a second mean vector based on an average of the set of vectors 604. The vector deviation computation module 412 computes an acceptable deviation for the set of vectors 602 and an acceptable deviation for the set of vectors 604. The tamper detection module 414 determines whether the second vector is within the acceptable deviation of the first vector to determine whether both the first and second vector point to a similar direction (e.g., within the acceptable deviation, for example, 10 degrees). If the tamper detection module 414 determines that the second vector points to a different direction outside the acceptable deviation of the first vector, the tamper detection module 414 generates a tamper notification to the communication module 418.

In another example embodiment, the vector pattern computation module 408 determines that the first set of vectors 602 define a two-dimensional plane. The tamper detection module 414 determines that the second vector is outside (not included in) the two-dimensional plane defined by the first set of vectors 602 and generates the tamper notification to the communication module 418. In another example, the tamper detection module 414 determines that one or more vectors 604 do not fit in the two-dimensional plane defined by the first set of vectors 602 and generates the tamper notification to the communication module 418. In another example, the tamper detection module 414 determines that each one of the vectors 604 do not fit in the two-dimensional plane defined by the first set of vectors 602 and generates the tamper notification to the communication module 418.

In another example embodiment, the vector pattern computation module 408 determines that the first set of vectors 602 define a set (or range) of two-dimensional planes based on the acceptable deviation. The tamper detection module 414 determines that the second vector is outside (not included in) any plane from the set of the two-dimensional planes defined by the first set of vectors 602 and generates the tamper notification to the communication module 418. In another example, the tamper detection module 414 determines that one or more vectors 604 do not fit in any of the planes defined by the first set of vectors 602 and generates the tamper notification to the communication module 418. In another example, the tamper detection module 414 determines that each one of the vectors 604 do not fit in the any of the planes defined by the first set of vectors 602 and generates the tamper notification to the communication module 418.

Figure 7:
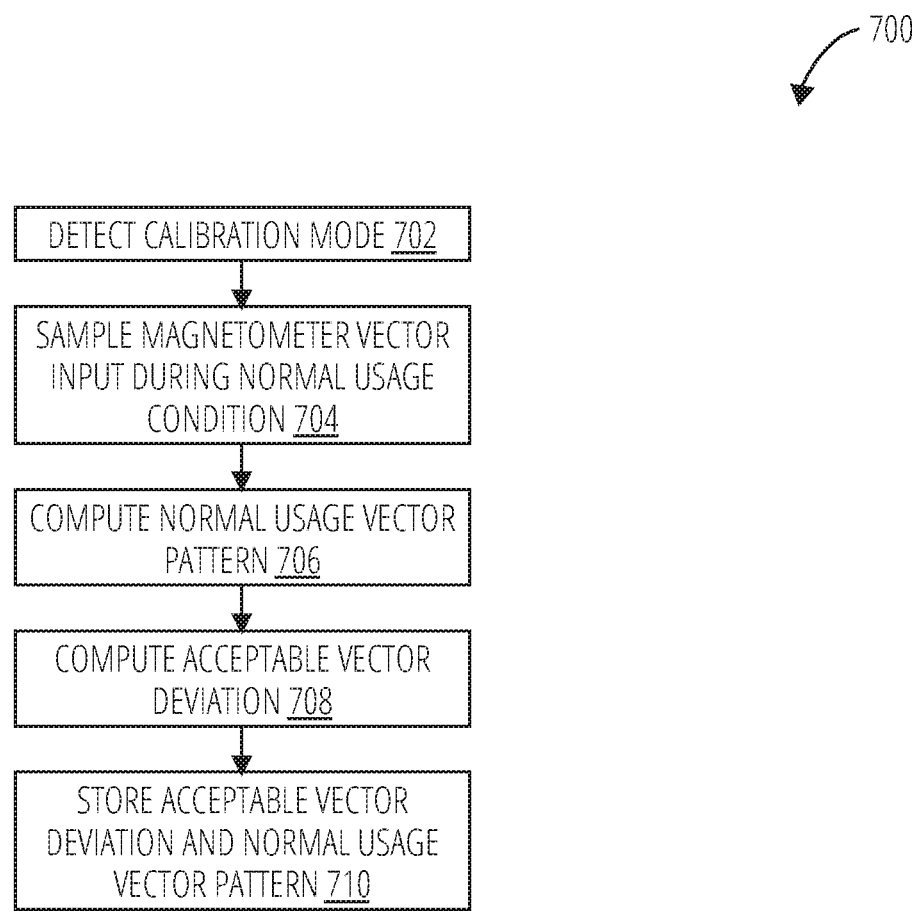
FIG. 7 illustrates a method for recording sample vectors in accordance with one example embodiment.

FIG. 7 illustrates a method 700 for recording sample vectors in accordance with one example embodiment. At block 702, the sensor device 106 detects a calibration mode. In one example, the sensor device 106 receives a user input indicating the calibration mode. In another example embodiment, a machine learning engine determines the normal usage pattern of the sensor device 106. At block 704, the sensor device 106 samples the magnetometer vector input during the normal usage condition or calibration mode. At block 706, the sensor device 106 computes the normal usage vector pattern (e.g., mean direction, and intensity) based on the sampled sensor data. At block 708, the sensor device 106 computes the acceptable vector deviation based on the normal usage vector pattern. At block 710, the sensor device 106 stores the acceptable vector deviation and normal usage vector pattern.

Figure 8:
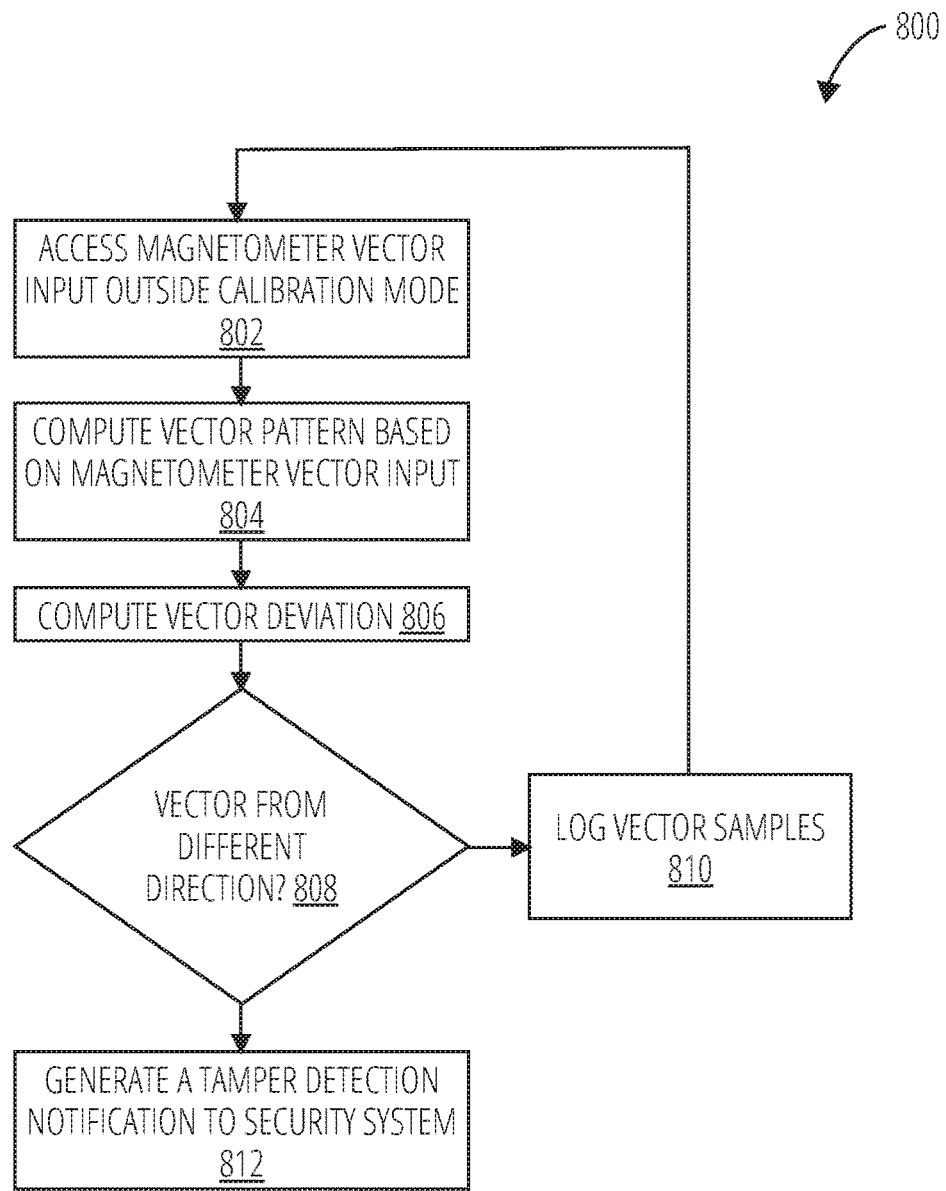
FIG. 8 illustrates a method for detecting a tamper of a sensor in accordance with one embodiment.
Figure 9:
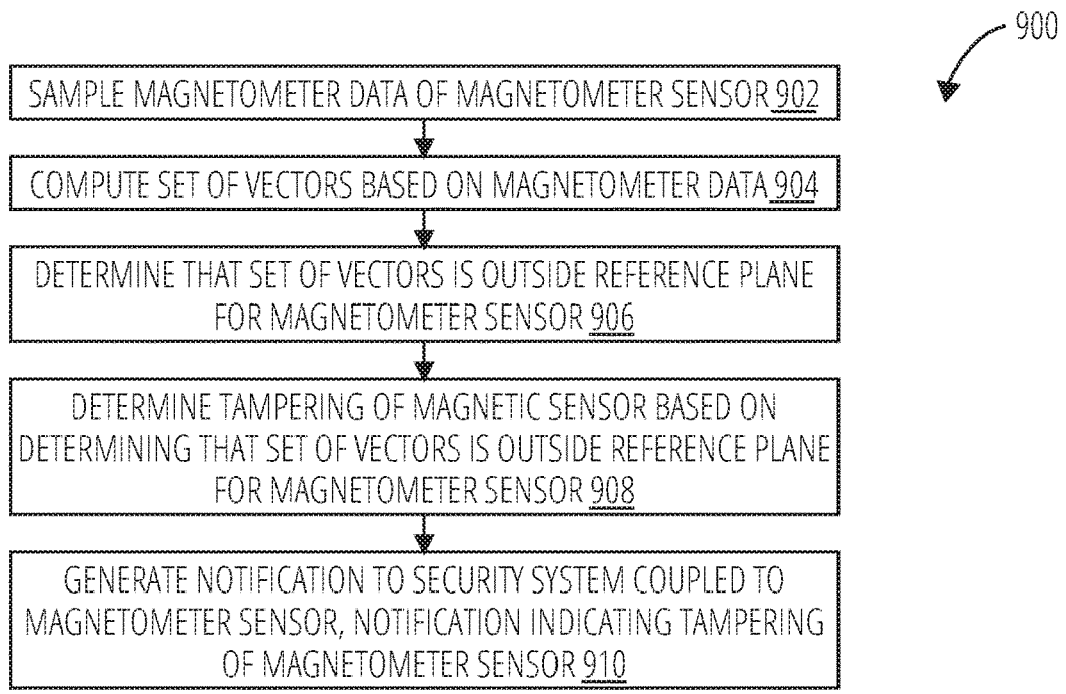
FIG. 9 illustrates a routine for detecting tampering of a magnetometer sensor in accordance with one embodiment.

FIG. 8 illustrates a method 800 for detecting a tamper of a sensor in accordance with one embodiment. At block 802, the sensor device 106 accesses new sensor data from the magnetometer 404. At block 804, the sensor device 106 computers the vector pattern based on the new sensor data. At block 806, the sensor device 106 computes the vector deviation based on the vector pattern. At decision block 808, the sensor device 106 determines whether a vector direction from the vector pattern is different than a range of vector direction based on the acceptable vector deviation and normal usage vector pattern previously calculated in block 710. At block 810, if the vector direction falls within the range of vector directions for normal usage vector pattern, the sensor device 106 logs the vector samples in a storage device. At block 812, if the vector direction is outside the range of vector directions for normal usage vector pattern, the sensor device 106 generates a tamper detection notification to security system 110.

In block 902, routine 900 samples magnetometer data of the magnetometer sensor. In block 904, routine 900 computes a set of vectors based on the magnetometer data. In block 906, routine 900 determines that the set of vectors is outside a reference plane for the magnetometer sensor. In block 908, routine 900 determines a tampering of the magnetic sensor based on determining that the set of vectors is outside the reference plane for the magnetometer sensor. In block 910, routine 900 generates a notification to a security system coupled to the magnetometer sensor, the notification indicating the tampering of the magnetometer sensor.

Figure 10:
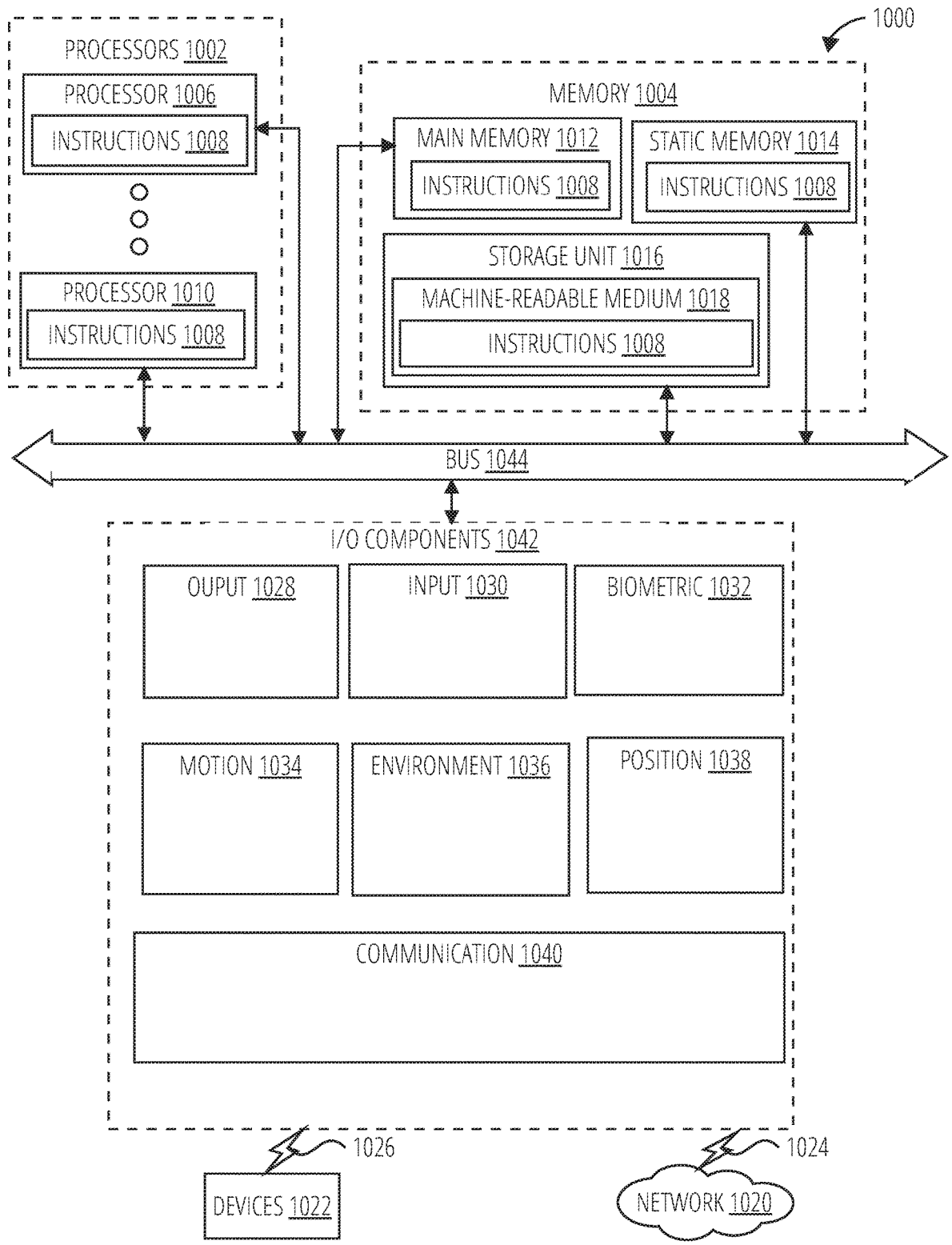
FIG. 10 is a diagrammatic representation of a machine in the form of a computer system within which a set of instructions may be executed for causing the machine to perform any one or more of the methodologies discussed herein, according to an example embodiment.

FIG. 10 is a diagrammatic representation of the machine 1000 within which instructions 1008 (e.g., software, a program, an application, an applet, an app, or other executable code) for causing the machine 1000 to perform any one or more of the methodologies discussed herein may be executed. For example, the instructions 1008 may cause the machine 1000 to execute any one or more of the methods described herein. The instructions 1008 transform the general, non-programmed machine 1000 into a particular machine 1000 programmed to carry out the described and illustrated functions in the manner described. The machine 1000 may operate as a standalone device or may be coupled (e.g., networked) to other machines. In a networked deployment, the machine 1000 may operate in the capacity of a server machine or a client machine in a server-client network environment, or as a peer machine in a peer-to-peer (or distributed) network environment. The machine 1000 may comprise, but not be limited to, a server computer, a client computer, a personal computer (PC), a tablet computer, a laptop computer, a netbook, a set-top box (STB), a PDA, an entertainment media system, a cellular telephone, a smart phone, a mobile device, a wearable device (e.g., a smart watch), a smart home device (e.g., a smart appliance), other smart devices, a web appliance, a network router, a network switch, a network bridge, or any machine capable of executing the instructions 1008, sequentially or otherwise, that specify actions to be taken by the machine 1000. Further, while only a single machine 1000 is illustrated, the term "machine" shall also be taken to include a collection of machines that individually or jointly execute the instructions 1008 to perform any one or more of the methodologies discussed herein.

The machine 1000 may include processors 1002, memory 1004, and I/O components 1042, which may be configured to communicate with each other via a bus 1044. In an example embodiment, the processors 1002 (e.g., a Central Processing Unit (CPU), a Reduced Instruction Set Computing (RISC) processor, a Complex Instruction Set Computing (CISC) processor, a Graphics Processing Unit (GPU), a Digital Signal Processor (DSP), an ASIC, a Radio-Frequency Integrated Circuit (RFIC), another processor, or any suitable combination thereof) may include, for example, a processor 1006 and a processor 1010 that execute the instructions 1008. The term "processor" is intended to include multi-core processors that may comprise two or more independent processors (sometimes referred to as "cores") that may execute instructions contemporaneously. Although FIG. 10 shows multiple processors 1002, the machine 1000 may include a single processor with a single core, a single processor with multiple cores (e.g., a multi-core processor), multiple processors with a single core, multiple processors with multiples cores, or any combination thereof.

The memory 1004 includes a main memory 1012, a static memory 1014, and a storage unit 1016, both accessible to the processors 1002 via the bus 1044. The main memory 1004, the static memory 1014, and storage unit 1016 store the instructions 1008 embodying any one or more of the methodologies or functions described herein. The instructions 1008 may also reside, completely or partially, within the main memory 1012, within the static memory 1014, within machine-readable medium 1018 within the storage unit 1016, within at least one of the processors 1002 (e.g., within the processor's cache memory), or any suitable combination thereof, during execution thereof by the machine 1000.

The I/O components 1042 may include a wide variety of components to receive input, provide output, produce output, transmit information, exchange information, capture measurements, and so on. The specific I/O components 1042 that are included in a particular machine will depend on the type of machine. For example, portable machines such as mobile phones may include a touch input device or other such input mechanisms, while a headless server machine will likely not include such a touch input device. It will be appreciated that the I/O components 1042 may include many other components that are not shown in FIG. 10. In various example embodiments, the I/O components 1042 may include output components 1028 and input components 1030. The output components 1028 may include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor, resistance mechanisms), other signal generators, and so forth. The input components 1030 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and/or force of touches or touch gestures, or other tactile input components), audio input components (e.g., a microphone), and the like.

In further example embodiments, the I/O components 1042 may include biometric components 1032, motion components 1034, environmental components 1036, or position components 1038, among a wide array of other components. For example, the biometric components 1032 include components to detect expressions (e.g., hand expressions, facial expressions, vocal expressions, body gestures, or eye tracking), measure biosignals (e.g., blood pressure, heart rate, body temperature, perspiration, or brain waves), identify a person (e.g., voice identification, retinal identification, facial identification, fingerprint identification, or electroencephalogram-based identification), and the like. The motion components 1034 include acceleration sensor components (e.g., accelerometer), gravitation sensor components, rotation sensor components (e.g., gyroscope), and so forth. The environmental components 1036 include, for example, illumination sensor components (e.g., photometer), temperature sensor components (e.g., one or more thermometers that detect ambient temperature), humidity sensor components, pressure sensor components (e.g., barometer), acoustic sensor components (e.g., one or more microphones that detect background noise), proximity sensor components (e.g., infrared sensors that detect nearby objects), gas sensors (e.g., gas detection sensors to detection concentrations of hazardous gases for safety or to measure pollutants in the atmosphere), or other components that may provide indications, measurements, or signals corresponding to a surrounding physical environment. The position components 1038 include location sensor components (e.g., a GPS receiver component), altitude sensor components (e.g., altimeters or barometers that detect air pressure from which altitude may be derived), orientation sensor components (e.g., magnetometers), and the like.

Communication may be implemented using a wide variety of technologies. The I/O components 1042 further include communication components 1040 operable to couple the machine 1000 to a network 1020 or devices 1022 via a coupling 1024 and a coupling 1026, respectively. For example, the communication components 1040 may include a network interface component or another suitable device to interface with the network 1020. In further examples, the communication components 1040 may include wired communication components, wireless communication components, cellular communication components, Near Field Communication (NFC) components, Bluetooth® components (e.g., Bluetooth® Low Energy), Wi-Fi® components, and other communication components to provide communication via other modalities. The devices 1022 may be another machine or any of a wide variety of peripheral devices (e.g., a peripheral device coupled via a USB).

Moreover, the communication components 1040 may detect identifiers or include components operable to detect identifiers. For example, the communication components 1040 may include Radio Frequency Identification (RFID) tag reader components, NFC smart tag detection components, optical reader components (e.g., an optical sensor to detect one-dimensional bar codes such as Universal Product Code (UPC) bar code, multi-dimensional bar codes such as Quick Response (QR) code, Aztec code, Data Matrix, Dataglyph, MaxiCode, PDF417, Ultra Code, UCC RSS-2D bar code, and other optical codes), or acoustic detection components (e.g., microphones to identify tagged audio signals). In addition, a variety of information may be derived via the communication components 1040, such as location via Internet Protocol (IP) geolocation, location via Wi-Fi® signal triangulation, location via detecting an NFC beacon signal that may indicate a particular location, and so forth.

The various memories (e.g., memory 1004, main memory 1012, static memory 1014, and/or memory of the processors 1002) and/or storage unit 1016 may store one or more sets of instructions and data structures (e.g., software) embodying or used by any one or more of the methodologies or functions described herein. These instructions (e.g., the instructions 1008), when executed by processors 1002, cause various operations to implement the disclosed embodiments.

The instructions 1008 may be transmitted or received over the network 1020, using a transmission medium, via a network interface device (e.g., a network interface component included in the communication components 1040) and using any one of a number of well-known transfer protocols (e.g., hypertext transfer protocol (HTTP)). Similarly, the instructions 1008 may be transmitted or received using a transmission medium via the coupling 1026 (e.g., a peer-to-peer coupling) to the devices 1022.

Although an embodiment has been described with reference to specific example embodiments, it will be evident that various modifications and changes may be made to these embodiments without departing from the broader scope of the present disclosure. Accordingly, the specification and drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

EXAMPLES

Example 1 is a method for detecting tampering of a magnetometer sensor, the method comprising: sampling magnetometer data of the magnetometer sensor; computing a set of vectors based on the magnetometer data; determining that the set of vectors is outside a reference plane for the magnetometer sensor; determining a tampering of the magnetic sensor based on determining that the set of vectors is outside the reference plane for the magnetometer sensor; and generating a notification to a security system coupled to the magnetometer sensor, the notification indicating the tampering of the magnetometer sensor.

In example 2, the subject matter of claim 1 further comprises: determining a first mode of operation of the security system, wherein sampling the magnetometer data includes sampling first magnetometer data during the first mode of operation and sampling second magnetometer data during a second mode of operation of the security system; and forming the reference plane based on the sampling of the first magnetometer data from the first mode of operation of the security system, wherein computing the set of vectors is based on the second magnetometer data.

In example 3, the subject matter of claim 2 further comprises: wherein the first mode of operation includes a calibration mode of the magnetometer sensor, and the second mode of operation includes a non-calibration mode of the magnetometer sensor.

In example 4, the subject matter of claim 2 further comprises: using machine learning to distinguish the first mode of operation from the second mode operation.

In example 5, the subject matter of claim 2 further comprises: receiving a user input at the magnetometer sensor, the user input indicating a calibration mode; and determining the first mode of operation based on the user input.

In example 6, the subject matter of claim 2, wherein determining the tampering further comprises: forming a plurality of reference sub-planes based on the sampling of the first magnetometer data from the first mode of operation of the security system; and determining that the set of vectors identify one or more directions outside the plurality of reference sub-planes.

In example 7, the subject matter of claim 1 further comprises: sampling first magnetometer data of the magnetometer sensor during a first mode of operation of the security system; computing a first set of vectors based on the first magnetometer data; computing a first vector deviation based on the first set of vectors; sampling second magnetometer data of the magnetometer sensor during a second mode of operation of the security system; computing a second set of vectors based on the second magnetometer data; computing a second vector deviation based on the second set of vectors; and determining the tampering of the magnetic sensor based on a comparison of the second set of vectors and the second vector deviation with the first set of vectors and the first vector deviation.

In example 8, the subject matter of claim 1, further comprising: computing a first usage vector pattern based on the first set of vectors, the first usage vector pattern indicating a first mean angle and a first mean intensity; computing a second usage vector pattern based on the second set of vectors, the second usage vector pattern indicating a second mean angle and a second mean intensity; and determining the tampering of the magnetic sensor based on detecting that the second usage vector pattern adjusted with the second vector deviation is outside the first usage vector pattern adjusted with the first vector deviation.

In example 9, the subject matter of claim 7, further comprising: computing a first mean angle relative to an axis of the magnetometer sensor based on the first set of vectors; computing a second mean angle relative to the axis of the magnetometer sensor based on the second set of vectors; defining an angular range formed by the first mean angle and the first vector deviation; detecting that the second mean angle is outside the angular range; and determining the tampering of the magnetic sensor in response to detecting that the second mean angle is outside the angular range.

In example 10, the subject matter of claim 1, further comprising: sampling second magnetometer data of the magnetometer sensor; computing a second set of vectors based on the second magnetometer data; determining that the second set of vectors is within the reference plane for the magnetometer sensor; storing the second magnetometer data in a storage device; and updating the reference plane based on the on the second set of vectors.

What is claimed is:

1. A method for detecting tampering of a magnetometer sensor, the method comprising:
    sampling magnetometer data of the magnetometer sensor;
    computing a set of vectors based on the magnetometer data;

determining that the set of vectors is outside a reference plane for the magnetometer sensor;
determining a tampering of the magnetic sensor based on determining that the set of vectors is outside the reference plane for the magnetometer sensor; and
generating a notification to a security system coupled to the magnetometer sensor, the notification indicating the tampering of the magnetometer sensor.

2. The method of claim 1, further comprising:
determining a first mode of operation of the security system, wherein sampling the magnetometer data includes sampling first magnetometer data during the first mode of operation and sampling second magnetometer data during a second mode of operation of the security system; and
forming the reference plane based on the sampling of the first magnetometer data from the first mode of operation of the security system, wherein computing the set of vectors is based on the second magnetometer data.

3. The method of claim 2, wherein the first mode of operation includes a calibration mode of the magnetometer sensor, and the second mode of operation includes a non-calibration mode of the magnetometer sensor.

4. The method of claim 2, further comprising:
using machine learning to distinguish the first mode of operation from the second mode operation.

5. The method of claim 2, further comprising:
receiving a user input at the magnetometer sensor, the user input indicating a calibration mode; and
determining the first mode of operation based on the user input.

6. The method of claim 2, wherein determining the tampering further comprises:
forming a plurality of reference sub-planes based on the sampling of the first magnetometer data from the first mode of operation of the security system; and
determining that the set of vectors identify one or more directions outside the plurality of reference sub-planes.

7. The method of claim 1, further comprising:
sampling first magnetometer data of the magnetometer sensor during a first mode of operation of the security system;
computing a first set of vectors based on the first magnetometer data;
computing a first vector deviation based on the first set of vectors;
sampling second magnetometer data of the magnetometer sensor during a second mode of operation of the security system;
computing a second set of vectors based on the second magnetometer data;
computing a second vector deviation based on the second set of vectors; and
determining the tampering of the magnetic sensor based on a comparison of the second set of vectors and the second vector deviation with the first set of vectors and the first vector deviation.

8. The method of claim 7, further comprising:
computing a first usage vector pattern based on the first set of vectors, the first usage vector pattern indicating a first mean angle and a first mean intensity;
computing a second usage vector pattern based on the second set of vectors, the second usage vector pattern indicating a second mean angle and a second mean intensity; and
determining the tampering of the magnetic sensor based on detecting that the second usage vector pattern adjusted with the second vector deviation is outside the first usage vector pattern adjusted with the first vector deviation.

9. The method of claim 7, further comprising:
computing a first mean angle relative to an axis of the magnetometer sensor based on the first set of vectors;
computing a second mean angle relative to the axis of the magnetometer sensor based on the second set of vectors;
defining an angular range formed by the first mean angle and the first vector deviation;
detecting that the second mean angle is outside the angular range; and
determining the tampering of the magnetic sensor in response to detecting that the second mean angle is outside the angular range.

10. The method of claim 1, further comprising:
sampling second magnetometer data of the magnetometer sensor;
computing a second set of vectors based on the second magnetometer data;
determining that the second set of vectors is within the reference plane for the magnetometer sensor;
storing the second magnetometer data in a storage device; and
updating the reference plane based on the on the second set of vectors.

11. A computing apparatus, the computing apparatus comprising:
a processor; and
a memory storing instructions that, when executed by the processor, configure the apparatus to:
sample magnetometer data of the magnetometer sensor;
compute a set of vectors based on the magnetometer data;
determine that the set of vectors is outside a reference plane for the magnetometer sensor;
determine a tampering of the magnetic sensor based on determining that the set of vectors is outside the reference plane for the magnetometer sensor; and
generate a notification to a security system coupled to the magnetometer sensor, the notification indicating the tampering of the magnetometer sensor.

12. The computing apparatus of claim 11, wherein the instructions further configure the apparatus to:
determine a first mode of operation of the security system, wherein sampling the magnetometer data includes sampling first magnetometer data during the first mode of operation and sampling second magnetometer data during a second mode of operation of the security system; and
form the reference plane based on the sampling of the first magnetometer data from the first mode of operation of the security system, wherein computing the set of vectors is based on the second magnetometer data.

13. The computing apparatus of claim 12, wherein the first mode of operation includes a calibration mode of the magnetometer sensor, and the second mode of operation includes a non-calibration mode of the magnetometer sensor.

14. The computing apparatus of claim 12, wherein the instructions further configure the apparatus to:
use machine learning to distinguish the first mode of operation from the second mode operation.

15. The computing apparatus of claim 12, wherein the instructions further configure the apparatus to:

receive a user input at the magnetometer sensor, the user input indicating a calibration mode; and
determine the first mode of operation based on the user input.

16. The computing apparatus of claim 12, wherein determining the tampering further comprises:
    form a plurality of reference sub-planes based on the sampling of the first magnetometer data from the first mode of operation of the security system; and
    determine that the set of vectors identify one or more directions outside the plurality of reference sub-planes.

17. The computing apparatus of claim 11,
    sample first magnetometer data of the magnetometer sensor during a first mode of operation of the security system;
    compute a first set of vectors based on the first magnetometer data;
    compute a first vector deviation based on the first set of vectors;
    sample second magnetometer data of the magnetometer sensor during a second mode of operation of the security system;
    compute a second set of vectors based on the second magnetometer data;
    compute a second vector deviation based on the second set of vectors; and
    determine the tampering of the magnetic sensor based on a comparison of the second set of vectors and the second vector deviation with the first set of vectors and the first vector deviation.

18. The computing apparatus of claim 17, wherein the instructions further configure the apparatus to:
    compute a first usage vector pattern based on the first set of vectors, the first usage vector pattern indicating a first mean angle and a first mean intensity;
    compute a second usage vector pattern based on the second set of vectors, the second usage vector pattern indicating a second mean angle and a second mean intensity; and
    determine the tampering of the magnetic sensor based on detecting that the second usage vector pattern adjusted with the second vector deviation is outside the first usage vector pattern adjusted with the first vector deviation.

19. The computing apparatus of claim 17, wherein the instructions further configure the apparatus to:
    compute a first mean angle relative to an axis of the magnetometer sensor based on the first set of vectors;
    compute a second mean angle relative to the axis of the magnetometer sensor based on the second set of vectors;
    define an angular range formed by the first mean angle and the first vector deviation;
    detect that the second mean angle is outside the angular range; and
    determine the tampering of the magnetic sensor in response to detecting that the second mean angle is outside the angular range.

20. A non-transitory computer-readable storage medium, the computer-readable storage medium including instructions that when executed by a computer, cause the computer to:
    sample magnetometer data of the magnetometer sensor;
    compute a set of vectors based on the magnetometer data;
    determine that the set of vectors is outside a reference plane for the magnetometer sensor;
    determine a tampering of the magnetic sensor based on determining that the set of vectors is outside the reference plane for the magnetometer sensor; and
    generate a notification to a security system coupled to the magnetometer sensor, the notification indicating the tampering of the magnetometer sensor.

* * * * *

UNITED STATES PATENT AND TRADEMARK OFFICE
CERTIFICATE OF CORRECTION

PATENT NO. : 10,755,554 B2
APPLICATION NO. : 16/146724
DATED : August 25, 2020
INVENTOR(S) : Nichols, Sr. et al.

Page 1 of 1

It is certified that error appears in the above-identified patent and that said Letters Patent is hereby corrected as shown below:

In the Claims

In Column 16, Line 27, in Claim 10, delete "on the on the" and insert --on the-- therefor Signed and Sealed this
Nineteenth Day of January, 2021

Andrei Iancu
*Director of the United States Patent and Trademark Office*